(12) United States Patent
Ding

(10) Patent No.: US 11,297,740 B2
(45) Date of Patent: Apr. 5, 2022

(54) STORAGE-TYPE MODULAR DATA CENTER

(71) Applicant: SUZHOU A-RACK INFORMATION TECHNOLOGY CO., LTD., Jiangsu (CN)

(72) Inventor: Zhiyong Ding, Jiangsu (CN)

(73) Assignee: SUZHOU A-RACK INFORMATION TECHNOLOGY CO., LTD, Jiangsu (CN)

( * ) Notice: Subject to any disclaimer, the term of this patent is extended or adjusted under 35 U.S.C. 154(b) by 425 days.

(21) Appl. No.: 16/348,851

(22) PCT Filed: Jan. 23, 2019

(86) PCT No.: PCT/CN2019/072767
§ 371 (c)(1),
(2) Date: May 9, 2019

(87) PCT Pub. No.: WO2020/098155
PCT Pub. Date: May 22, 2020

(65) Prior Publication Data
US 2021/0329818 A1 Oct. 21, 2021

(30) Foreign Application Priority Data
Nov. 14, 2018 (CN) .......................... 201811354311.2

(51) Int. Cl.
*H05K 7/20* (2006.01)
*B01D 46/00* (2022.01)
(Continued)

(52) U.S. Cl.
CPC ......... *H05K 7/20818* (2013.01); *B01D 39/04* (2013.01); *B01D 46/44* (2013.01);
(Continued)

(58) Field of Classification Search
CPC ............... H05K 7/20818; H05K 7/203; H05K 7/20309; H05K 7/20736; B01D 39/04;
(Continued)

(56) References Cited

U.S. PATENT DOCUMENTS 5,550,710 A * 8/1996 Rahamim ............. G06F 1/1632
361/679.33
5,796,580 A * 8/1998 Komatsu ............ H05K 7/20727
361/679.47
(Continued)

FOREIGN PATENT DOCUMENTS

CN 205316560 12/1899
CN 203068706 U 7/2013
(Continued)

OTHER PUBLICATIONS

International Search Report and Written Opinon dated Aug. 7, 2019 in International Patent Application No. PCT/CN2019/072767.

Primary Examiner — Anatoly Vortman
(74) Attorney, Agent, or Firm — Byrne Poh LLP

(57) ABSTRACT

Disclosed is a storage-type modular data center. The storage-type modular data center includes a box, a dust removing module, an evaporative cooling module, and an air supply module. The box is provided with an air inlet and an air outlet. A server is disposed between the air inlet and the air outlet. The dust removing module is disposed between the server and the air inlet. The evaporative cooling module is disposed between the server and the air inlet, and includes an evaporative media and a water sprinkling tray module. One end of the evaporative media is immersed in liquid contained in the water sprinkling tray module. The air supply module is operative to drive air to flow between the air inlet and the air outlet.

15 Claims, 8 Drawing Sheets

(51) Int. Cl.
*B01D 46/44* (2006.01)
*B01D 39/04* (2006.01)
*B01D 46/62* (2022.01)

(52) U.S. Cl.
CPC ............. *B01D 46/62* (2022.01); *H05K 7/203* (2013.01); *H05K 7/20309* (2013.01); *H05K 7/20736* (2013.01); *B01D 2279/45* (2013.01)

(58) Field of Classification Search
CPC . B01D 46/0023; B01D 46/44; B01D 2279/45
USPC ..................................................... 361/679.47
See application file for complete search history.

(56) References Cited

U.S. PATENT DOCUMENTS

| | | | | |
|---|---|---|---|---|
| 7,534,167 | B2 * | 5/2009 | Day ................... | H05K 7/20745 |
| | | | | 454/187 |
| 7,859,834 | B2 * | 12/2010 | Fukuda ............. | G11B 33/1406 |
| | | | | 361/679.46 |
| 7,889,495 | B2 * | 2/2011 | Tachikawa ............. | G06F 1/203 |
| | | | | 361/679.48 |
| 9,414,531 | B1 * | 8/2016 | Towner ............. | H05K 7/20745 |
| 10,271,462 | B1 * | 4/2019 | Ross ................... | H05K 7/20827 |
| 2004/0075981 | A1 * | 4/2004 | Kim ....................... | G06F 1/206 |
| | | | | 361/679.47 |
| 2006/0011330 | A1 * | 1/2006 | Wang ................... | H05K 7/20163 |
| | | | | 165/122 |
| 2007/0267337 | A1 * | 11/2007 | Yang ..................... | F02M 37/34 |
| | | | | 210/338 |
| 2012/0127656 | A1 * | 5/2012 | Driggers ............. | G05B 15/02 |
| | | | | 361/679.47 |
| 2012/0211198 | A1 * | 8/2012 | Kinkel ................... | F24F 1/0328 |
| | | | | 165/104.14 |
| 2015/0156926 | A1 * | 6/2015 | Levesque ............ | H05K 7/2079 |
| | | | | 361/679.47 |
| 2017/0112023 | A1 * | 4/2017 | Mao ................... | H05K 7/20745 |
| 2020/0163247 | A1 * | 5/2020 | Ding .................. | H05K 7/20827 |

FOREIGN PATENT DOCUMENTS

| | | | |
|---|---|---|---|
| CN | 205316560 U | * | 6/2016 |
| CN | 207284037 U | | 4/2018 |
| CN | 108413539 A | | 8/2018 |
| CN | 108592333 A | | 9/2018 |
| CN | 207990846 U | | 10/2018 |
| CN | 111389176 A | * | 7/2020 |
| WO | WO 2018079909 | | 5/2018 |

* cited by examiner

STORAGE-TYPE MODULAR DATA CENTER

CROSS-REFERENCE TO RELATED APPLICATIONS

This application is a U.S. National Stage Application, filed under 35 U.S.C. § 371, of International Patent Application No. PCT/CN2019/072767 filed Jan. 23, 2019 which claims priority to Chinese patent application No. 201811354311.2 filed on Nov. 14, 2018 with the State Intellectual Property Office of the People's Republic of China, each of which is hereby incorporated by reference herein in its entirety.

TECHNICAL FIELD

The present disclosure relates to the technical field of computer technology, and more particularly relates to, for example, a storage-type modular data center.

BACKGROUND

A storage-type modular data center is a high-performance computer in a network environment and is configured to store large amounts of R&D data information, financial information, mails, and so on. Therefore, a server in a data center is connected to more than hundreds of computers, forming a large network that is demanding in processing speed and data security. The higher the configuration, the stronger the reliability of the system.

The storage-type modular data center is generally used in an outdoor environment. The server generates large amounts of heat during operation, making the internal temperature of the server too high and thus causing the server to process data at a reduced speed or even shut down automatically. At present, the heat generated by the server is generally taken away by flowing air, which however produces a poor cooling effect. In addition, in an outdoor environment, the concentration of dust and oil in the air is far greater than that in the room. The dust or oil is attached to the server inside the data center, causing the server to undergo uneven heat dissipation or poor contact or even a short circuit in some serious conditions.

SUMMARY

The present disclosure provides a storage-type modular data center capable of cooling a data center while preventing dust and oil in the air from accumulating inside a server.

In one embodiment, the present disclosure provides a storage-type modular data center. The storage-type modular data center includes a box, a dust removing module, an evaporative cooling module and an air supply module;

The box is provided with an air inlet and an air outlet;

The dust removing module is disposed between the air inlet and the air outlet;

The evaporative cooling module is disposed between the air inlet and the air outlet and includes an evaporative media and a water sprinkling tray module;

The air supply module is operative to drive air to flow between the air inlet and the air outlet.

In one embodiment, one end of the evaporative media is immersed in liquid contained in the water sprinkling tray module when the storage-type modular data center is in an operating state.

In one embodiment, the evaporative media is vertically arranged and the water sprinkling tray module is disposed below the evaporative media.

In one embodiment, the water sprinkling tray module includes a water sprinkling tray, the water sprinkling tray is configured to hold the liquid, and the water sprinkling tray communicates with a water inlet pipe and a water outlet pipe, where the water inlet pipe is provided with a control valve.

In one embodiment, inside the box is provided a first partition, a second partition, and a third partition which are connected in sequence, the first partition is connected to an inner wall of the box, an air passage is formed between the first partition, the second partition, the third partition and the inner wall of the box, and two ends of the air passage communicate with the air inlet and the air outlet, respectively.

In one embodiment, the air outlet includes a first air outlet and a second air outlet, the first air outlet is defined in the second partition and communicates with the air passage, and the second air outlet communicates with an outside of the box.

In one embodiment, the air inlet, the first air outlet and the second air outlet are each provided with an air valve.

In one embodiment, at least one of the two air valves corresponding to the first air outlet and the second air outlet is open when the storage-type modular data center is in an operating state.

In one embodiment, the dust removing module includes a filter, and the filter is disposed between the air inlet and the evaporative cooling module.

In one embodiment, the dust removing module further includes filter cotton and a filter screen, and the filter screen is disposed between the filter cotton and the filter.

In one embodiment, the air supply module is disposed inside the box and between a server and the evaporative cooling module.

In one embodiment, the storage-type modular data center further includes a controller, where the evaporative cooling module, the dust removing module and the air supply module are all connected to the controller.

In one embodiment, the storage-type modular data center further includes a server, and the server is disposed between the air inlet and the air outlet.

In one embodiment, the dust removing module is disposed between the server and the air inlet, and the evaporative cooling module is disposed between the server and the air inlet.

Figure 1:
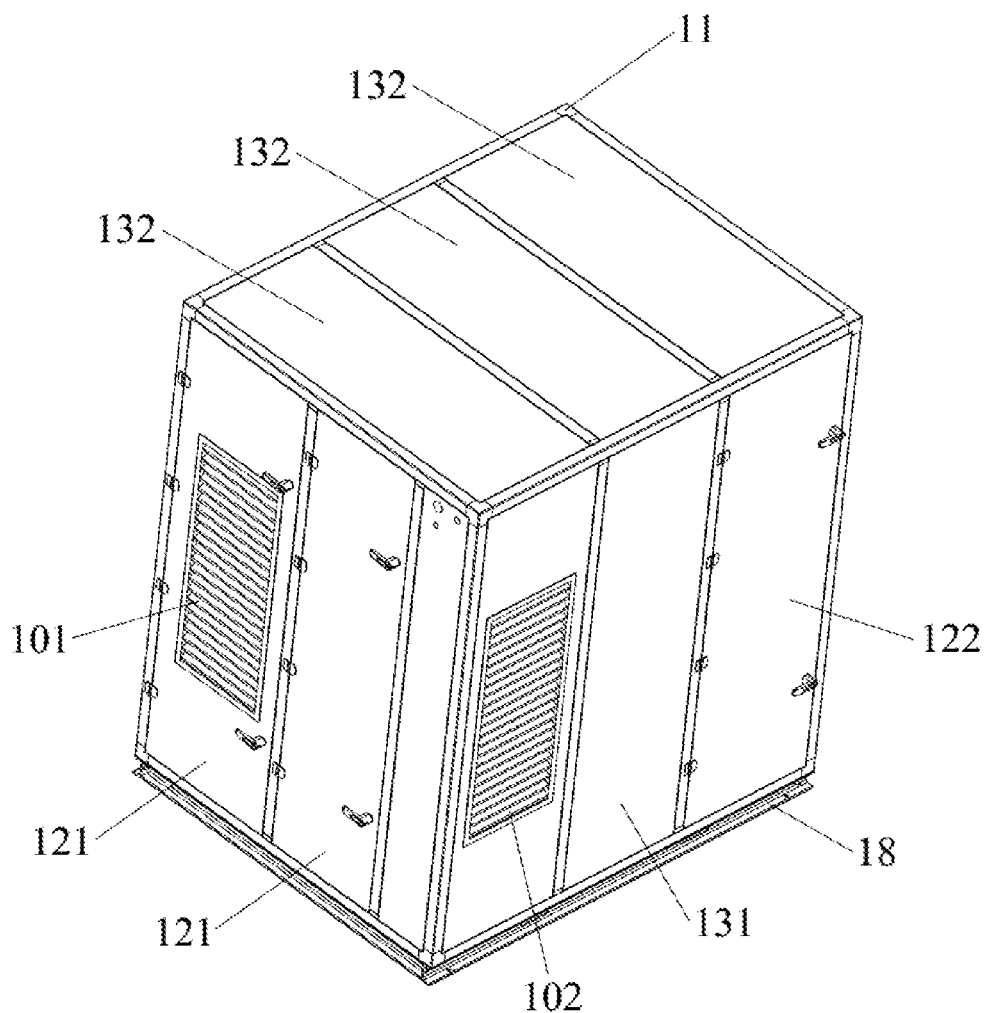
FIG. 1 is a schematic diagram illustrating an exterior structure of a storage-type modular data center according to embodiment one of the present disclosure.

101: Air Inlet; 102: Second Air Outlet; 11: Frame; 121: First Box Door; 122: Second Box Door; 123: Third Box Door; 131: First Insulation Plate; 132: Second Insulation plate; 133: Third Insulation Plate; 134: Fourth Insulation Plate; 14: First Partition; 15: Second Partition; 16: Third Partition; 17: Ventilating Plate; 18: Steel Base; 19: Water Fender; 10: First Face; 20: Second Face; 30: Third Face; 40: Fourth Face; 2: Dust Removing Module; 21: Filter Cotton; 22: Filter Screen; 23: Filter; 3: Evaporative Cooling Module; 31: Evaporative media; 32: Water Sprinkling Tray; 321: Water Inlet Pipe; 322: Water Outlet Pipe; 323: Control Valve; 33: Water Sprinkler; 4: Air Supply Component; 41: Fan Mounting Piece; 42: Fan; 51: First Air Valve; 52: Second Air Valve; 53: Third Air Valve; 6: Controller; 7: Cabinet.

DETAILED DESCRIPTION

The solutions of the present disclosure are described hereinafter through embodiments in conjunction with the accompanying drawings. The detailed description of the embodiments set forth below is intended to explain and not to limit the present disclosure. For ease of description, only a part rather than all related to the present disclosure is illustrated in the accompanying drawings.

Embodiment One

As illustrated in FIG. 1 to FIG. 4a, this embodiment provides a storage-type modular data center. The storage-type modular data center includes a box, a dust removing module 2, an evaporative cooling module 3, and an air supply module 4. The box is provided with an air inlet 101 and an air outlet. The evaporative cooling module 3 is disposed between the air inlet 101 and the air outlet, and includes an evaporative media 31 and a water sprinkling tray module. When the storage-type modular data center is in an operating state, one end of the evaporative media 31 is immersed in the liquid contained in the sprinkling tray module. In this embodiment, the liquid is water. Of course, in other embodiments, the liquid can be ethanol or other evaporable liquids. The dust removing module 2 is disposed between the air inlet 101 and the air outlet. The air supply module 4 is operative to drive air to flow between the air inlet 101 and the air outlet. In one embodiment, the storage-type modular data center further includes a server, and the server is disposed between the air inlet 101 and the air outlet. The evaporative cooling module 3 is disposed between the server and the air inlet 101. The dust removing module 2 is disposed between the server and the air inlet 101. In one embodiment, the evaporative cooling module 3 is disposed between the dust removing module 2 and the server, and the air supply module 4 is disposed between the evaporative cooling module 3 and the server.

The air supply module 4 makes the air flow between the air inlet 101 and the air outlet. The dust removing module 2 filters the air and removes dust from the air. The evaporative media 31 of the evaporative cooling module 3 cools the air and further removes dust from the air through evaporation and heat absorption. The air that has been cooled and undergone dust removal passes through the server and replaces and discharges the heat generated by the server so as to cool the server. In this way, the server is cooled, and impurities such as dust and oil in the air are prevented from accumulating in the server which would reduce the heat dissipation functionality of the server. Through the water sprinkling tray module, the evaporative media 31 can absorb liquid by itself to ensure the cooling effect of the evaporative media 31 on the air through evaporation and cooling.

Figure 2:
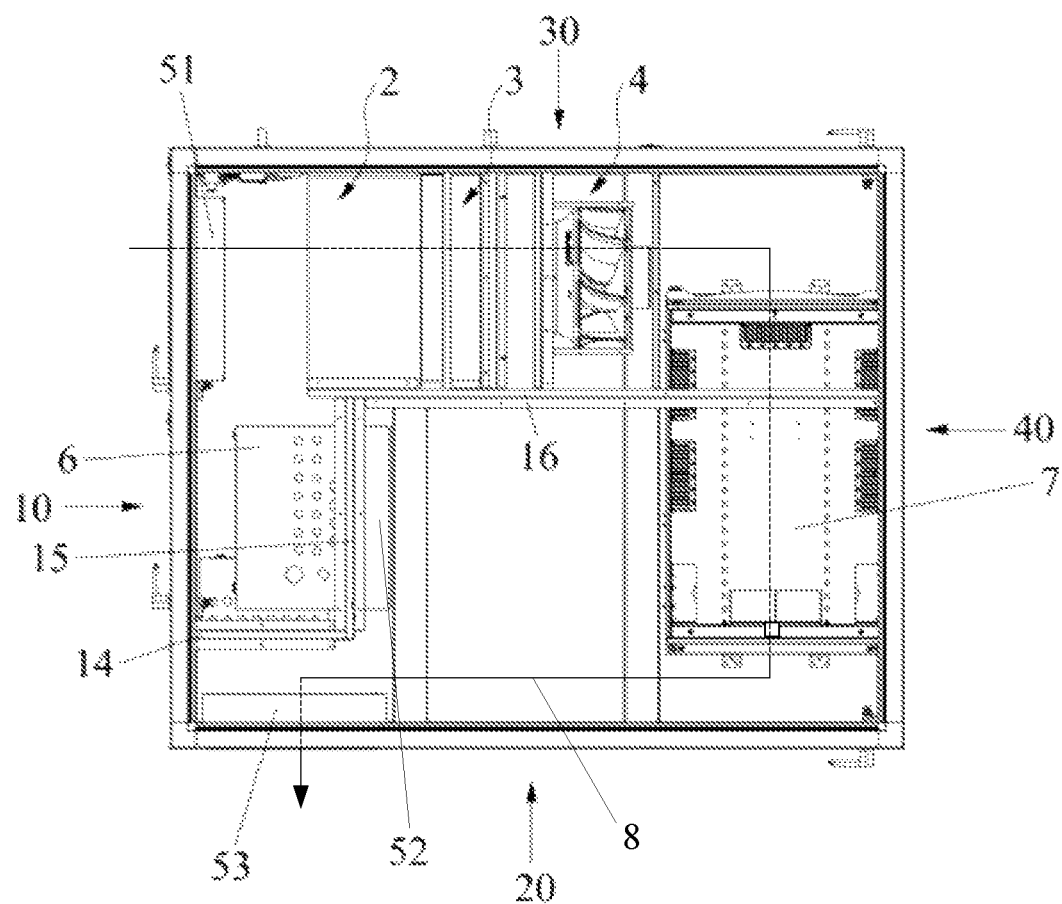
FIG. 2 is a top view illustrating a structure of an interior structure of a storage-type modular data center according to embodiment one of the present disclosure.
Figure 3:
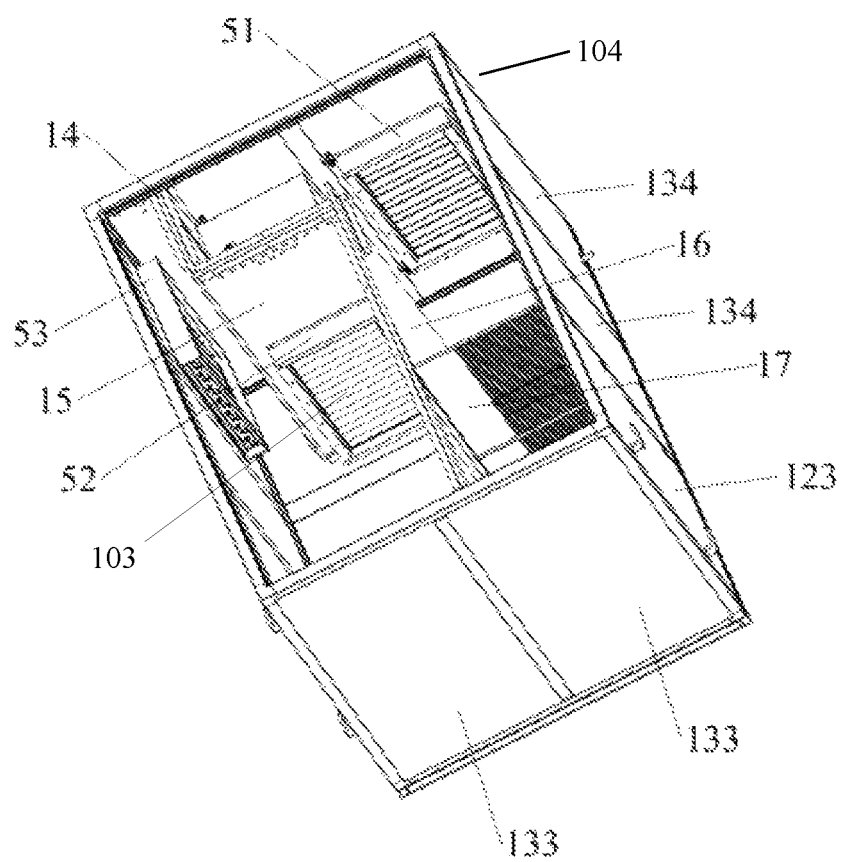
FIG. 3 is a schematic diagram illustrating a box according to embodiment one of the present disclosure.

As illustrated in FIGS. 1 to 3, the box includes a frame 11, a steel base 18, a box door, and an insulation plate. The frame 11 is secured to the steel base 18. The steel base 18 can not only support the box, but also has a socket, making it easy to carry the storage-type modular data center. In this embodiment, the frame 11 is a cuboid, one side of the frame 11 connected to the steel base 18 is provided with a bottom plate, and one side of the frame 11 opposite to the bottom plate is provided with three second insulation plates 132. Four sides of the frame 11 in the vertical direction are named a first face 10, a second face 20, a third face 30, and a fourth face 40. The first face 10 is provided with two first box doors 121. One of the first box doors 121 is provided with the preceding air inlet 101. The second face 20 is adjacent to the first face 10. The second face 20 is provided with two first insulation plates 131 and one second box door 122. The two first insulation plates 131 are disposed adjacent to each other. The first insulation plate 131 close to the first face 10 is provided with the preceding air outlet. The third face 30 adjacent to the first face 10 is provided with two fourth insulation plates 134 and one third box door 123. The two fourth insulation plates 134 are disposed adjacent to each other. The fourth face 40 is provided with two third insulation plates 133. The insulation plates can not only prevent external heat from entering the inside of the box, but can also prevent the cooled air from exchanging heat with the outside, thereby improving the heat dissipation performance of the server and the heat dissipation effect of the cooled air on the server. The box doors facilitate module, dismodule, and maintenance of the storage-type modular data center.

As illustrated in FIG. 2, a cabinet 7 is disposed in the box and configured to hold the server. In this embodiment, one cabinet 7 is provided and, correspondingly, one server is provided. In one embodiment, the type of the cabinet 7 is ACS62100. Of course, in other embodiments, the number of cabinets 7 can be set to one or more according to actual needs and, correspondingly, the number of servers is set to two or more, and the type of the cabinet 7 can be adjusted according to the type of the server.

As illustrated in FIGS. 2 and 3, the inside of the box is provided with a first partition 14, a second partition 15, and a third partition 16 that are connected in sequence, and the three partitions are vertically arranged. The first partition 14 is connected to an inner wall of the box. The second partition 15 is connected to and vertical to the first partition 14. The third partition 16 is connected to and vertical to the second partition 15. An air passage 8 is formed between the first partition 14, the second partition 15, the third partition 16 and the inner wall of the box. Two ends of the air passage 8 communicate with the air inlet 101 and the air outlet. The dust removing module 2, the evaporative cooling module 3 and the server are sequentially disposed in the air passage 8.

In this embodiment, the air outlet includes a first air outlet 103 and a second air outlet 102. The first air outlet 103 is defined in the second partition 15 and communicates with the air inlet 101. The second air outlet 102 is disposed on one of the second insulation plates 132 on the second face 20 in the box and communicates with the inside of the box and the outside of the box. In addition, to control the flow quantity of the air, the air inlet 101 and the two air outlets are provided with air valves: a first air valve 51, a second air valve 52 and a third air valve 53. In one embodiment, at least one of the second air valve 52 and the third air valve 53 is open when the storage-type modular data center is in the operating state. That is, when only the second air valve 52 corresponding to the first air outlet 103 is open, after the air that has passed through the server returns to the air passage 8 and then is cooled, the server is cooled again, and the air in the box is internally circulated. When only the third air valve 53 corresponding to the second air outlet 102 is open, the air that has passed through the server is discharged out of the box to ventilate the inside of the box. When the second air valve 52 and the third air valve 53 are both open, one part of the air that has passed through the server passes through the first air outlet 103 and enters the air passage 8, and the other part of the air that has passed through the server passes through the second air outlet 102 and is discharged out of the box.

As illustrated in FIGS. 2 and 3, the storage-type modular data center further includes a controller 6 connected to the dust removing module 2, the evaporative cooling module 3, the air supply module 4, and the three air valves. The controller performs control and adjustment according to actual conditions. For example, the controller controls the air supply module 4 to adjust the flow speed and flow quantity of the air, and controls the three air valves to adjust the flow quantity of the air and switch between three air flow states. Furthermore, the controller 6 facing the first face 10 of the box is not provided with the first door 121 of the air inlet 101, so as to make it easy to operate the controller 6.

As illustrated in FIG. 3, the storage-type modular data center further includes a ventilating plate 17 disposed between the air supply module 4 and the server. The ventilating plate 17 is evenly provided with multiple ventilating holes to shunt the air coming from the air supply component 4 through the ventilating holes of the ventilating plate 17, so that the cooled air is in full contact with the server or encloses the server to take away the heat generated by the server and cool the server.

Figure 4A:
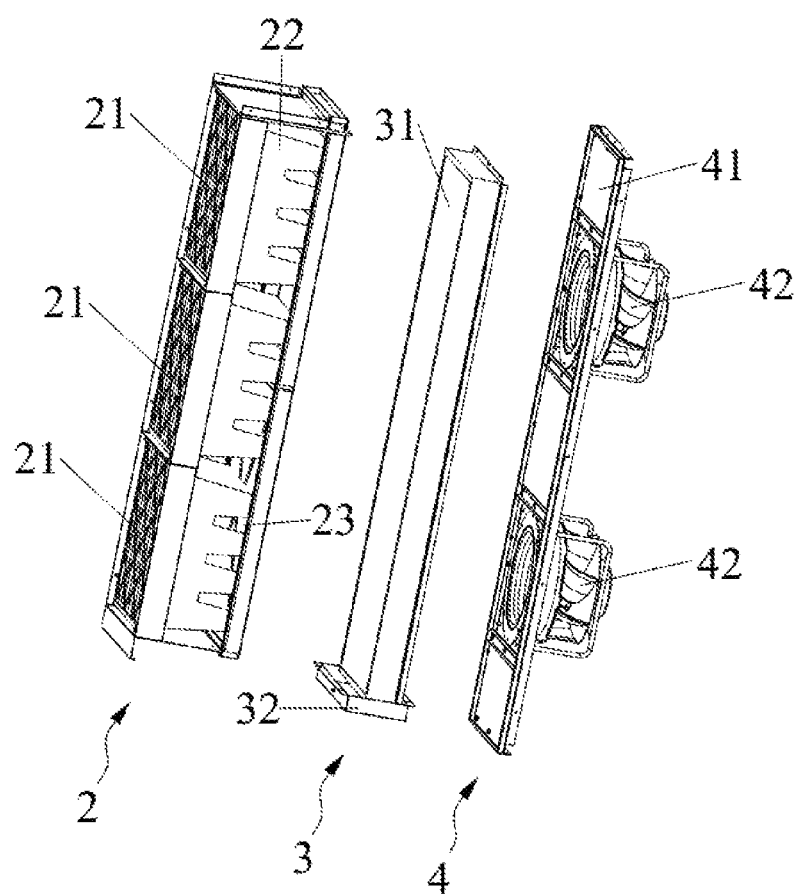
FIG. 4a is a schematic diagram illustrating a dust removing module, an evaporative cooling module, and an air supply module according to embodiment one of the present disclosure.

As illustrated in FIG. 4a, the dust removing module 2 includes filter cotton 21, a filter screen 22, and a filter 23. The filter cotton 21, the filter screen 22 and the filter 23 are all disposed between the third partition 16 and the inner wall of the box. The filter cotton 21, the filter screen 22 and the filter 23 cooperate with each other to efficiently purify the air and remove dust, oil and other impurities in the air to prevent dust, oil and other impurities from accumulating in the server. In this embodiment, in the vertical direction, three filter cottons 21 are provided, three filter screens 22 are provided, the three filter screens 22 are in one-to-one correspondence with the three filter cottons 21, and two filters 23 are provided. Of course, in other embodiments, the number and installation order of the filter cottons 21, filter screens 22 and filters 23 can be adjusted according to actual needs.

Figure 4B:
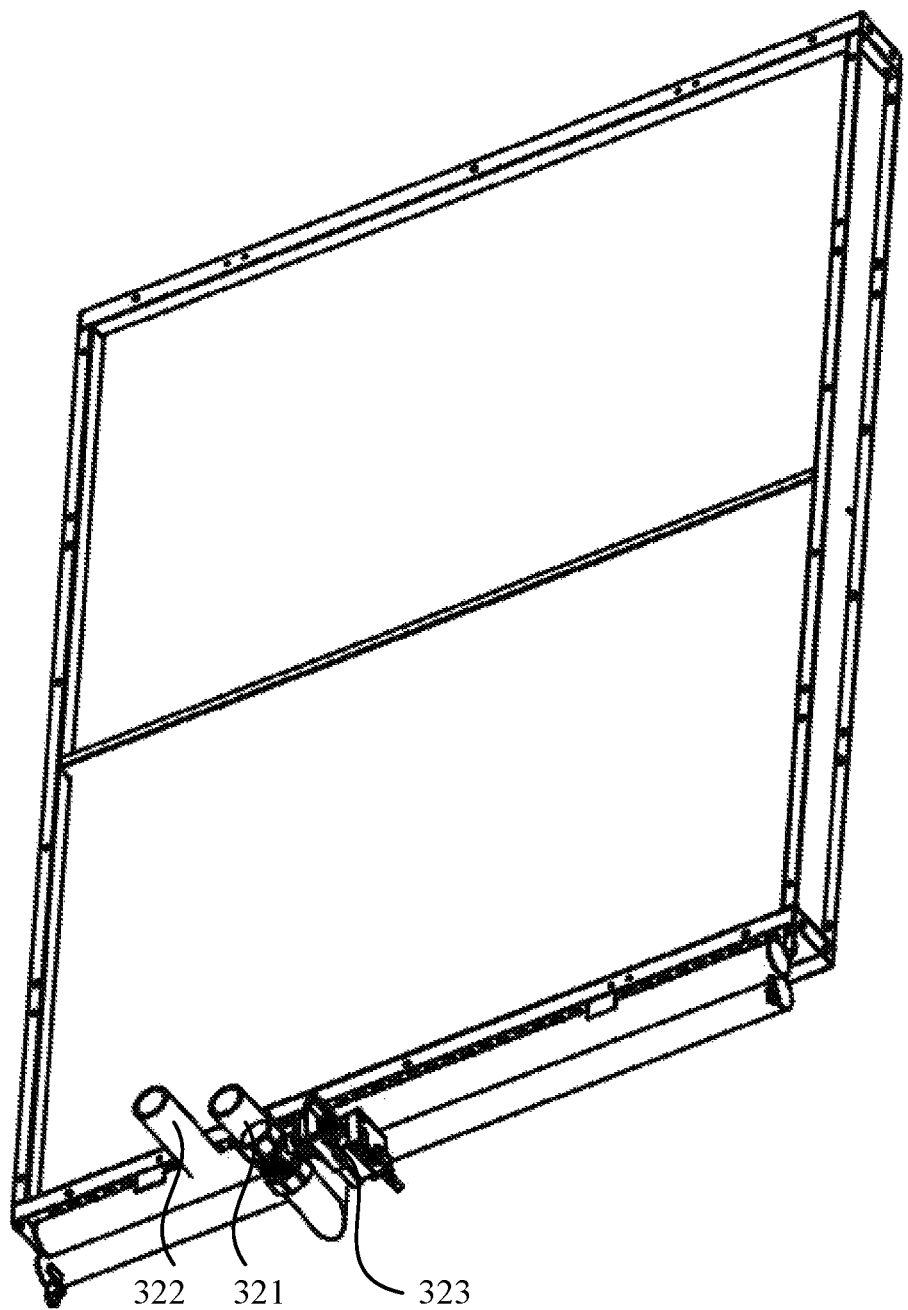
FIG. 4b is a partial schematic diagram illustrating an evaporative cooling module according to embodiment one of the present disclosure.
Figure 4C:
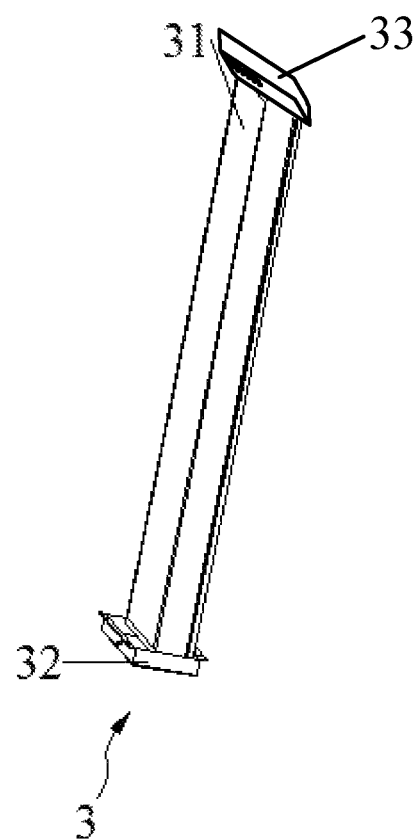
FIG. 4c is a partial schematic diagram illustrating another evaporative cooling module according to embodiment one of the present disclosure.

As illustrated in FIGS. 4a, 4b and 4c, the water sprinkling tray module 32 includes a water sprinkling tray 32, and a water inlet pipe 321 and an water outlet pipe 322 communicating with the water sprinkling tray module 32. In one embodiment, the water inlet pipe 321 is provided with a control valve 323. In one embodiment, the evaporative media 31 is wetted by the water inlet pipe 321 and the control valve 323, the evaporative media 31 evaporates moisture to remove heat for the cooling purposes, and the excess water flows through the evaporative media to the water sprinkling tray 32 and flows out through the water outlet pipe 322. The water sprinkling tray 32 is configured to hold water. In one embodiment, the evaporative media 31 is vertically arranged, one end of the evaporative media 31 is immersed in the water in the water sprinkling tray 32. The unique corrugated cross structure of the evaporative media 31 enables the evaporative media 31 to absorb moisture from the water sprinkling tray 32 by itself and maximizes the contact area between moisture and air to enhance evaporation efficiency and improve the cooling effect on the air. In one embodiment, the storage-type modular data center further includes a water sprinkler 33, the water inlet pipe 321 is connected to the water sprinkler 33, the water sprinkler 33 is disposed above the evaporative media 31, the water sprinkler 33 sprinkles water on the evaporative media 31, the evaporative media 31 evaporates moisture to remove heat for the purpose of cooling, and the excess water flows through the evaporative media to the water sprinkling tray 32 and flows out through the water outlet pipe 322.

Furthermore, the water inlet pipe 321 is further connected to a water supply device (not shown in the figure), and the water supply device may be a water pump or a water tank at a high place. When the water supply device is a water tank, the water inlet pipe 321 is provided with a control valve 323, the control valve 323 is connected to the controller 6, and the controller 6 can adjust the water amount according to the temperature of the server to increase or decrease the cooling effect of the evaporative media 31 on the air and reduce unnecessary loss of energy. When the water supply device is a water pump, the water inlet pipe 321 is provided with a control valve 323, the control valve 323 and the water pump are both connected to the controller 6, the controller 6 can adjust the water supply amount of the water pump and/or the opening degree of the control valve 323 according to the temperature of the server so as to increase or decrease the cooling effect of the evaporative media 31 on the air and reduce unnecessary loss of energy.

As illustrated in FIG. 4a, the air supply module 4 includes a fan mounting piece 41 and a fan 42, the fan 42 is mounted on the fan mounting piece 41 and connected to the controller 6, and the fan mounting piece 41 is mounted between the third partition 16 and the inner wall of the box. In this embodiment, two fans 42 are provided and the two fans 42 are arranged in the vertical direction. The fans 42 cause the air to flow in the air passage 8. The rotational speed of the fans 42 can be controlled to increase or decrease the flow speed and flow quantity of the air, thereby improving or reducing the cooling effect on the server. Of course, in other embodiments, the air supply module 4 may also be a blower or the like and disposed outside the box.

The working process of the storage-type modular data center will be described below.

1. The controller 6 controls the opening degree of the first air valve 51 and controls at least one of the second air valve 52 and the third air valve 53 to open.

2. The controller 6 controls the operation of the fan 42, filter 23, control valve 323 and/or the water pump. Under the action of the fan 42, the air enters the box through the air inlet 101, passes through the dust removing module 2, the evaporative cooling module 3, the fan 42, and the ventilating plate 17 sequentially in the air passage 8, and then contacts the server to replace and discharge the heat generated by the server to cool the server. Then the air enters the air passage 8 again through the first air outlet 103 or is discharged out of the box through the second air outlet 102. Alternatively, one part of the air enters the air passage 8 again through the first air outlet 103 and the other part of the air is discharged out of the box through the second air outlet 102. In this process, the controller 6 adjusts the rotational speed of the two fans 42, the opening degree of the control valve 323, and/or the rotation speed of the water pump according to actual needs.

Embodiment Two

Figure 5:
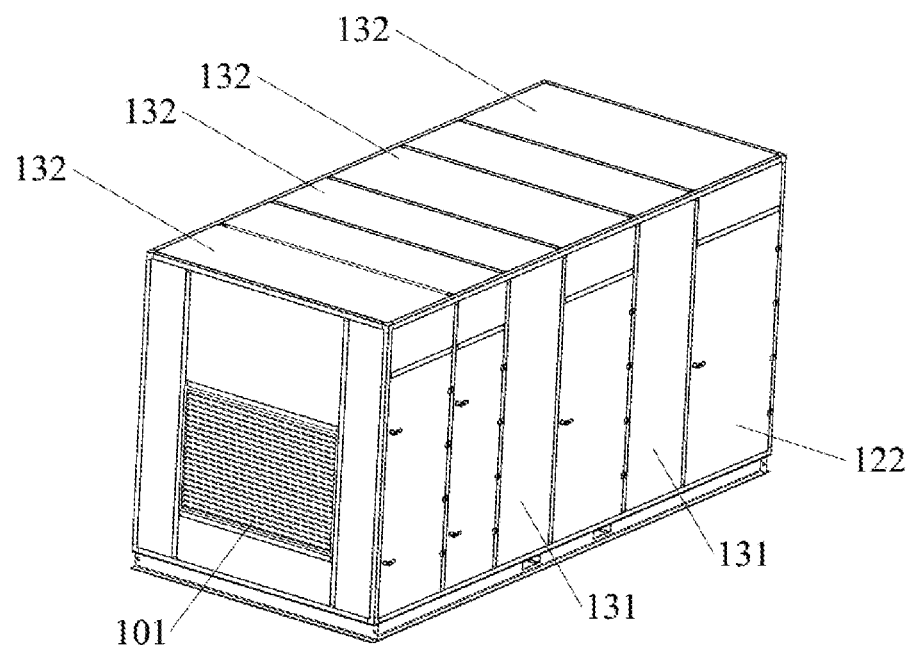
FIG. 5 is a schematic diagram illustrating an exterior structure of a storage-type modular data center according to embodiment two of the present disclosure.
Figure 6:
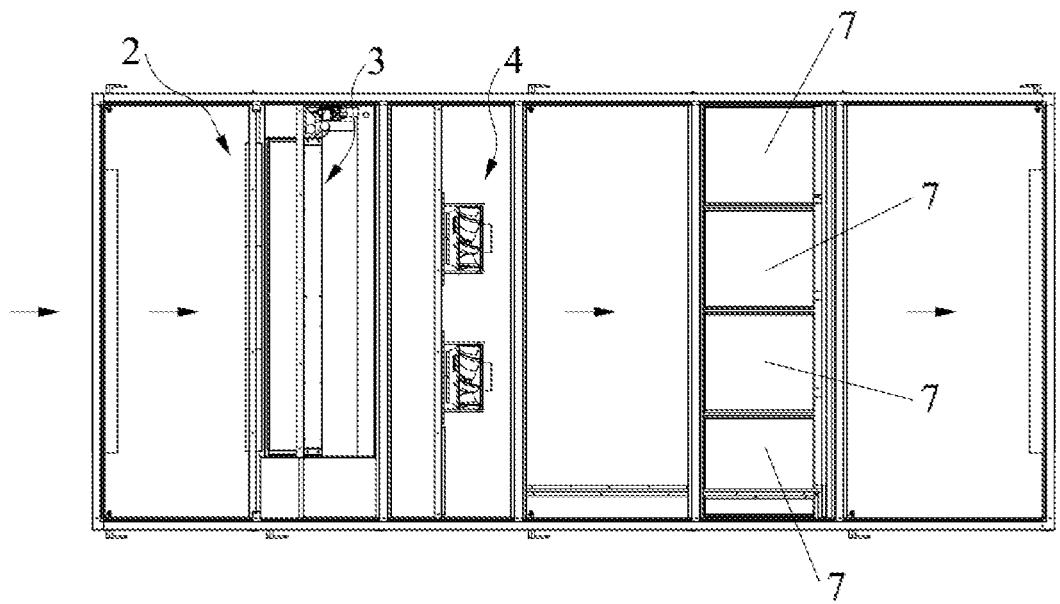
FIG. 6 is a top view illustrating a structure of an interior of a storage-type modular data center according to embodiment two of the present disclosure.

As illustrated in FIGS. 5 and 6, this embodiment provides a storage-type modular data center. The storage-type modular data center in this embodiment has a basically same structure as that in embodiment one except that: in this embodiment, the inside of the box of the storage-type modular data center does not include a first partition, a second partition, and a third partition, two opposite sides of the box are provided with an air inlet 101 and an air outlet, the air outlet communicates with the inside of the box and the outside of the box, a dust removing module 2, an evaporative cooling module 3, an air supply module 4 and a cabinet 7 are disposed in sequence between the air inlet 101 and the air outlet, and a server is disposed in the cabinet 7; in this embodiment, four cabinets 7 are provided and each cabinet 7 is provided with one server, and of course, in other embodiments, the number of cabinets 7 can be set according to actual needs.

Embodiment Three

Figure 7:
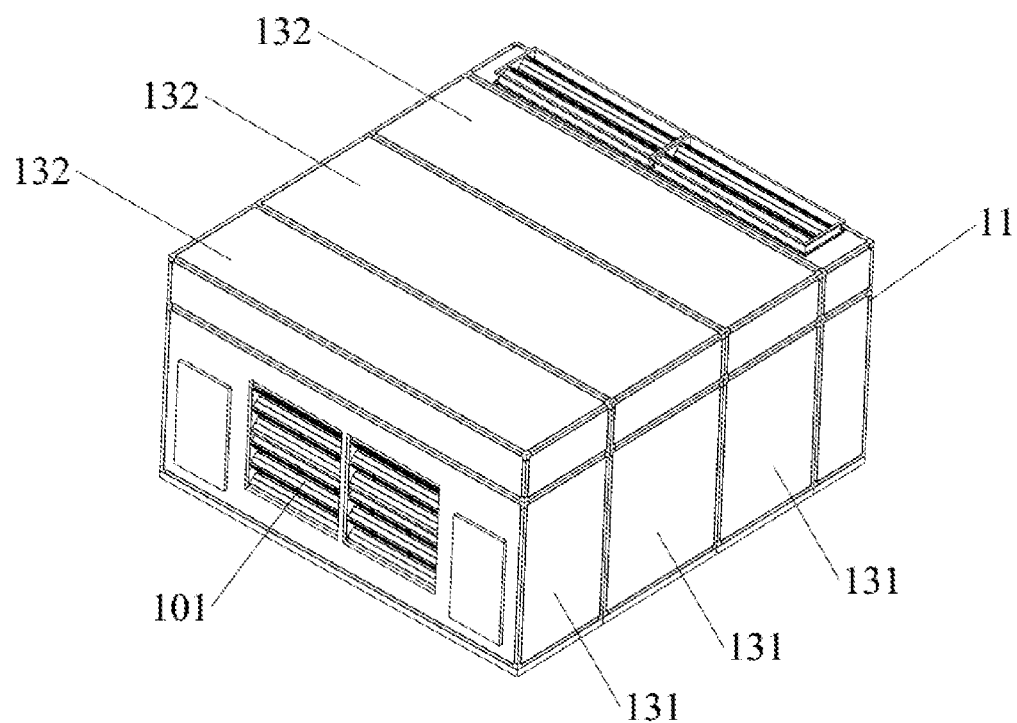
FIG. 7 is a schematic diagram illustrating an exterior of a storage-type modular data center according to embodiment three of the present disclosure.
Figure 8:
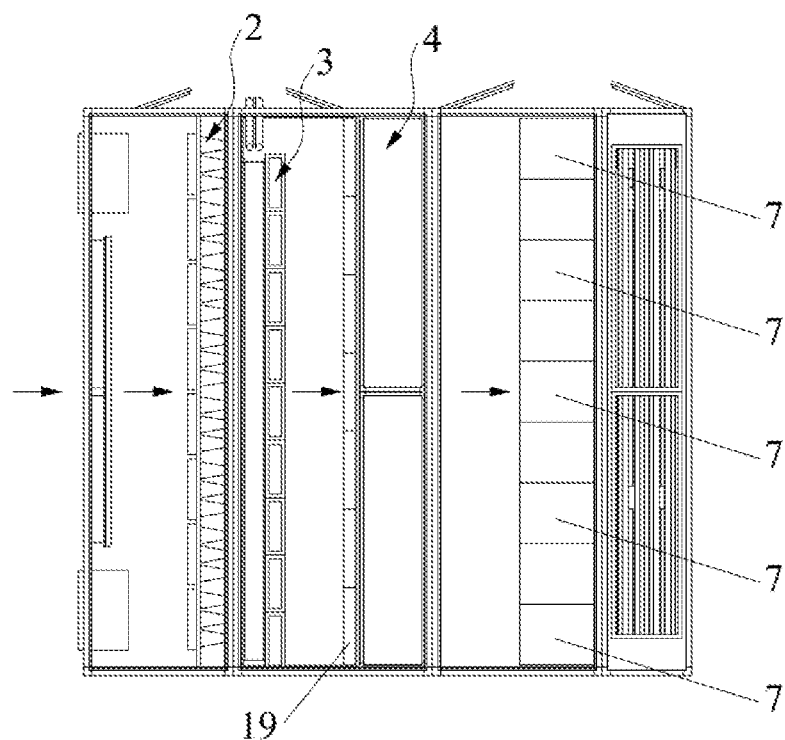
FIG. 8 is a top view illustrating a structure of an interior of a storage-type modular data center according to embodiment three of the present disclosure.

As illustrated in FIGS. 7 and 8, this embodiment provides a storage-type modular data center. The storage-type modular data center in this embodiment has a basically same structure as that in embodiment one except that: in this embodiment, the inside of the box of the storage-type modular data center does not include a first partition, a second partition and a third partition, an air outlet is defined in the box, the air enters the box through an air inlet 101, passes through a dust removing module 2, an evaporative cooling module 3, and an air supply module 4 and then passes through a server to replace the heat generated by the server and is discharged out of the box; additionally, the evaporative cooling module 3 and the air supply module 4 are provided with a water fender 19, the water fender 19 can remove moisture from the air that has passed through the evaporative cooling module 3 to prevent the moisture from entering the server and causing a short circuit or structure erosion and damage inside the server; furthermore, nine cabinets 7 are provided in the storage-type modular data center and each cabinet 7 is provided with one server, and of course, in other embodiments, the number of cabinets 7 can be set according to actual needs.

What is claimed is:

1. A storage-type modular data center, comprising:
 a box, provided with an air inlet and an air outlet;
 a dust removing module, disposed between the air inlet and the air outlet;
 an evaporative cooling module, disposed between the air inlet and the air outlet, and comprising an evaporative medium and a water sprinkling tray module;
 an air supply module, operative to drive air to flow between the air inlet and the air outlet;
 a server disposed between the air inlet and the air outlet; and
 a ventilating plate disposed between the air supply module and the server, wherein the ventilating plate is provided with multiple ventilating holes to shunt the air coming from the air supply module through the ventilating holes of the ventilating plate to cool the server, wherein one end of the evaporative medium is immersed in a liquid contained in the water sprinkling tray module to absorb moisture from the water sprinkling tray module in response to the storage-type modular data center being in an operating state.

2. The storage-type modular data center of claim 1, wherein the evaporative medium is vertically arranged and the water sprinkling tray module is disposed below the evaporative medium.

3. The storage-type modular data center of claim 2, wherein the water sprinkling tray module comprises a water sprinkling tray configured to hold the liquid, and the water sprinkling tray is in communication with a water inlet pipe and a water outlet pipe, wherein the water inlet pipe is provided with a control valve.

4. The storage-type modular data center of claim 1, wherein inside the box is provided a first partition, a second partition, and a third partition, which are connected in sequence, wherein the first partition is connected to an inner wall of the box, an air passage is formed between the first partition, the second partition, the third partition, and the inner wall of the box, and two ends of the air passage are in communication with the air inlet and the air outlet, respectively.

5. The storage-type modular data center of claim 4, wherein the air outlet comprises a first air outlet and a second air outlet, the first air outlet is defined in the second partition and communicates with the air passage, and the second air outlet communicates with an outside of the box.

6. The storage-type modular data center of claim 5, wherein the air inlet, the first air outlet, and the second air outlet are separately provided with an air valve.

7. The storage-type modular data center of claim 6, wherein at least one of two air valves respectively corresponding to the first air outlet and the second air outlet is open in a case where the storage-type modular data center is in an operating state.

8. The storage-type modular data center of claim 1, wherein the dust removing module comprises a filter disposed between the air inlet and the evaporative cooling module.

9. The storage-type modular data center of claim 8, wherein the dust removing module further comprises a filter cotton and a filter screen, wherein the filter screen is disposed between the filter cotton and the filter.

10. The storage-type modular data center of claim 1, wherein the air supply module is disposed inside the box and between a server and the evaporative cooling module.

11. The storage-type modular data center of claim 1, further comprising a controller, wherein the evaporative cooling module, the dust removing module, and the air supply module are all connected to the controller.

12. The storage-type modular data center of claim 1, wherein the dust removing module is disposed between the server and the air inlet, and the evaporative cooling module is disposed between the server and the air inlet.

13. The storage-type modular data center of claim 2, further comprising a controller, wherein the evaporative cooling module, the dust removing module, and the air supply module are all connected to the controller.

14. The storage-type modular data center of claim 3, further comprising a controller, wherein the evaporative cooling module, the dust removing module, and the air supply module are all connected to the controller.

15. The storage-type modular data center of claim 4, further comprising a controller, wherein the evaporative cooling module, the dust removing module, and the air supply module are all connected to the controller.

* * * * *